(12) United States Patent
Rodder

(10) Patent No.: US 8,828,818 B1
(45) Date of Patent: Sep. 9, 2014

(54) METHODS OF FABRICATING INTEGRATED CIRCUIT DEVICE WITH FIN TRANSISTORS HAVING DIFFERENT THRESHOLD VOLTAGES

(71) Applicant: Samsung Electronics Co., Ltd., Suwon-si (KR)

(72) Inventor: Mark S. Rodder, University Park, TX (US)

(73) Assignee: Samsung Electronics Co., Ltd. (KR)

(*) Notice: Subject to any disclaimer, the term of this patent is extended or adjusted under 35 U.S.C. 154(b) by 1 day.

(21) Appl. No.: 13/801,367

(22) Filed: Mar. 13, 2013

(51) Int. Cl.
*H01L 29/78* (2006.01)

(52) U.S. Cl.
USPC .... 438/218; 438/260; 438/275; 257/E29.193; 257/E21.182

(58) Field of Classification Search
CPC ............... H01L 21/0245; H01L 21/02532; H01L 21/31658; H01L 21/823821; H01L 21/823878; H01L 21/845; H01L 27/0924; H01L 27/1211; H01L 29/41791; H01L 29/66795; H01L 29/785
See application file for complete search history.

(56) References Cited

U.S. PATENT DOCUMENTS

| 7,902,014 | B2 | 3/2011 | Doyle et al. |
| 8,169,027 | B2 | 5/2012 | Doyle et al. |
| 2005/0161739 | A1 | 7/2005 | Anderson et al. |
| 2006/0068553 | A1 | 3/2006 | Thean et al. |
| 2007/0069302 | A1 | 3/2007 | Jin et al. |
| 2007/0145487 | A1 | 6/2007 | Kavalieros et al. |
| 2007/0221956 | A1* | 9/2007 | Inaba ........................... 257/197 |
| 2007/0275513 | A1 | 11/2007 | Coronel et al. |
| 2007/0298549 | A1 | 12/2007 | Jurczak et al. |
| 2008/0079094 | A1 | 4/2008 | Jin et al. |
| 2009/0085027 | A1 | 4/2009 | Jin et al. |
| 2009/0152623 | A1 | 6/2009 | Goto et al. |
| 2009/0261381 | A1 | 10/2009 | Kim et al. |
| 2009/0267159 | A1* | 10/2009 | Tstsumura et al. ........... 257/369 |
| 2010/0264468 | A1 | 10/2010 | Xu |
| 2010/0317181 | A1 | 12/2010 | Chung et al. |
| 2011/0008937 | A1 | 1/2011 | Jin et al. |
| 2011/0068375 | A1 | 3/2011 | Jakschik et al. |

(Continued)

FOREIGN PATENT DOCUMENTS

KR    1020090012472    2/2009

OTHER PUBLICATIONS

Takagi et al. *Strained-Si/SiGe-on-Insulator CMOS Technology*; Electrochemical Society Meeting Abstracts, Apr. 30, 2003.

*Primary Examiner* — Zandra Smith
*Assistant Examiner* — Pamela E Perkins
(74) *Attorney, Agent, or Firm* — Myers Bigel Sibley & Sajovec, P.A.

(57) ABSTRACT

Methods of fabricating integrated circuit device with fin transistors having different threshold voltages are provided. The methods may include forming first and second semiconductor fins including first and second semiconductor materials, respectively, and covering at least one among the first and second semiconductor fins with a mask. The methods may further include depositing a compound semiconductor layer including the first and second semiconductor materials directly onto sidewalls of the first and second semiconductor fins not covered by the mask and oxidizing the compound semiconductor layer. The oxidization process oxidizes the first semiconductor material within the compound semiconductor layer while driving the second semiconductor material within the compound semiconductor layer into the sidewalls of the first and second semiconductor fins not covered by the mask.

11 Claims, 9 Drawing Sheets

(56) References Cited

U.S. PATENT DOCUMENTS

| | | |
|---|---|---|
| 2011/0108920 A1 | 5/2011 | Basker et al. |
| 2011/0147811 A1 | 6/2011 | Kavalieros et al. |
| 2011/0180847 A1 | 7/2011 | Ikeda et al. |
| 2011/0227165 A1 | 9/2011 | Basker et al. |
| 2012/0018785 A1 | 1/2012 | Xu |
| 2012/0074464 A1 | 3/2012 | Cea et al. |
| 2012/0156838 A1 | 6/2012 | Anderson et al. |
| 2012/0214282 A1 | 8/2012 | Kim et al. |

\* cited by examiner

METHODS OF FABRICATING INTEGRATED CIRCUIT DEVICE WITH FIN TRANSISTORS HAVING DIFFERENT THRESHOLD VOLTAGES

FIELD

The present disclosure generally relates to the field of integrated circuit devices and, more particularly, to field effect transistors.

BACKGROUND

Integrated circuit devices may need transistors with different threshold voltages. Accordingly, several technologies including adjustment of channel doping concentrations and gate work functions have been developed to implement transistors with different threshold voltages within one integrated circuit device. To adjust gate work functions, gate materials having different work functions and different channel materials may be used.

SUMMARY

A method of forming an integrated circuit device may include depositing a compound semiconductor layer including first and second semiconductor materials directly onto sidewalls of first and second semiconductor fins having unequal concentrations of the first and second semiconductor materials therein relative to each other. The method may further include oxidizing the first semiconductor material within the compound semiconductor layer for a sufficient duration to drive at least a majority of the second semiconductor material within the compound semiconductor layer into the first and second semiconductor fins. The method may also include removing oxidized portions of the compound semiconductor layer to thereby expose the sidewalls of the first and second semiconductor fins having unequal concentrations of the second semiconductor material therein.

According to some embodiments, the compound semiconductor layer may include $Si_{1-x}Ge_x$, where x may be in a range from about 0.1 to about 0.4.

In some embodiments, the second semiconductor fin may be at least substantially free of the second semiconductor material.

In some embodiments, the oxidizing may be preceded by converting at least a portion of the deposited compound semiconductor layer into single crystal.

According to some embodiments, the oxidizing may include oxidizing the entire compound semiconductor layer.

In some embodiments, the depositing may further include depositing the compound semiconductor layer directly on an isolation layer on which the first and second semiconductor fins extend, and the oxidizing may include oxidizing the entire compound semiconductor layer.

A method of forming an integrated circuit device may include forming a plurality of first and second semiconductor fins including first and second semiconductor materials, respectively, on a substrate and covering at least one among the plurality of first and second semiconductor fins with a mask. The method may further include depositing a compound semiconductor layer including the first and second semiconductor materials directly onto sidewalls of some of the plurality of first and second semiconductor fins not covered by the mask. The method may also include oxidizing the first semiconductor material within the compound semiconductor layer for a sufficient duration to drive at least a majority of the second semiconductor material within the compound semiconductor layer into the sidewalls of the some of the plurality of first and second semiconductor fins not covered by the mask and removing oxidized portions of the compound semiconductor layer to thereby expose the sidewalls of the some of the plurality of first and second semiconductor fins not covered by the mask.

In some embodiments, the second semiconductor fins may include $Si_{1-x}Ge_x$, where x may be in a range from about 0.1 to about 0.3.

According to some embodiments, at least one of the exposed sidewalls of the some of the plurality of first and second semiconductor fins not covered by the mask may have a greater concentration of the second semiconductor material therein relative to the at least one among the plurality of first and second semiconductor fins covered by the mask.

In some embodiments, the removing may further include removing the mask so that sidewalls of at least three of the plurality of first and second semiconductor fins are exposed, which have unequal concentrations of the second semiconductor material therein.

In some embodiments, at least one of the at least three of the plurality of first and second semiconductor fins may include only the first semiconductor material.

According to some embodiments, the covering may further include covering some of the plurality of first and second semiconductor fins with the mask. The exposed sidewalls of the some of the plurality of first and second semiconductor fins not covered by the mask may have greater concentrations of the second semiconductor material therein relative to corresponding ones of the some of the plurality of first and second semiconductor fins covered by the mask.

In some embodiments, the removing may further include removing the mask so that sidewalls of at least four of the plurality of first and second semiconductor fins are exposed, which have unequal concentrations of the second semiconductor material therein.

According to some embodiments, at least one of the at least four of the plurality of first and second semiconductor fins may include only the first semiconductor material.

In some embodiments, the oxidizing may be preceded by converting at least a portion of the deposited compound semiconductor layer into single crystal.

In some embodiments, the depositing may further include depositing the compound semiconductor layer directly on an isolation layer on which the plurality of first and second semiconductor fins extend, and wherein said oxidizing may include oxidizing the entire compound semiconductor layer.

According to some embodiments, the forming may include epitaxially growing some of the plurality of first and second semiconductor fins from a plurality of seed regions in the substrate by supplying the first and second semiconductor materials.

A method of forming an integrated circuit device may include forming a plurality of Si and SiGe fins on a substrate including an isolation layer. The plurality of Si and SiGe fins may extend on the isolation layer. The method may further include forming a mask layer covering at least one among the plurality of Si and SiGe fins and forming a compound semiconductor layer comprising Si and Ge directly on sidewalls of some of the plurality of Si and SiGe fins not covered by the mask layer and directly on the isolation layer. The method may also include oxidizing the entire compound semiconductor layer to oxidize Si therein for a sufficient duration to drive at least a majority of Ge within the compound semiconductor layer into the sidewalls of the some of the plurality of Si and SiGe fins not covered by the mask and removing oxidized portions of the compound semiconductor layer to thereby expose the sidewalls of the some of the plurality of Si and SiGe fins not covered by the mask.

In some embodiments, the forming may include forming the plurality of SiGe fins by epitaxially growing from a plurality of seed regions in the substrate by supplying Si and Ge.

DETAILED DESCRIPTION

Figure 1:
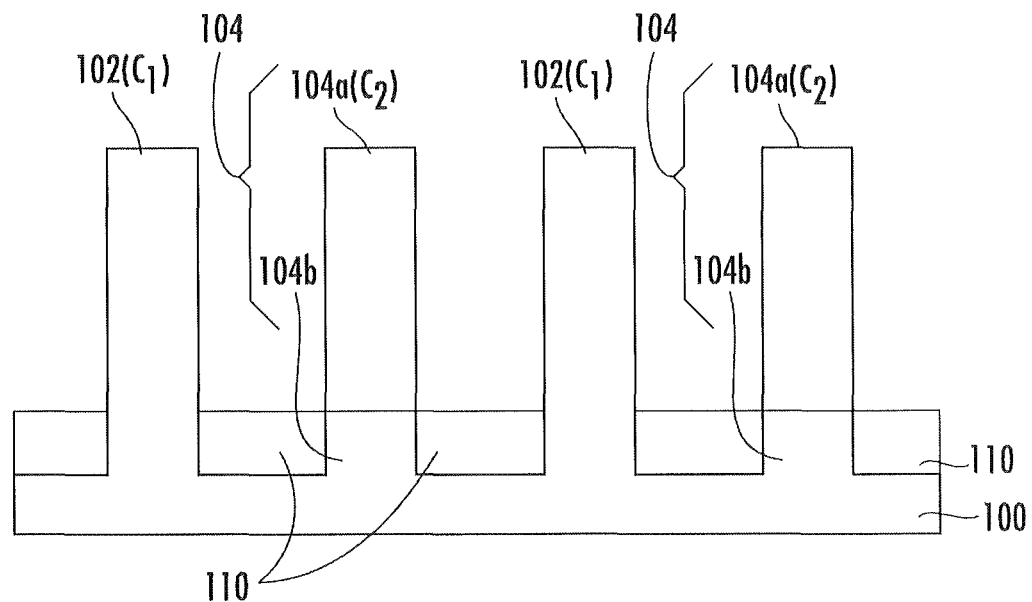
FIGS. 1 to 5 are cross-sectional views illustrating intermediate structures provided as portions of a method of fabricating semiconductor fins according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIGS. 1 to 5 are cross-sectional views illustrating intermediate structures provided as portions of a method of fabricating semiconductor fins according to some embodiments of the present inventive concept.

Referring to FIG. 1, first and second semiconductor fins 102, 104 are provided on a substrate 100. The first and second semiconductor fins 102, 104 may be partially buried in an isolation layer 110. Heights of the first and second semiconductor fins 102, 104 may be in a range from about 20 nm to about 50 nm and widths of those may be in a range from about 5 nm to 20 nm.

The substrate 100 may be, for example, a bulk silicon substrate.

The first and second semiconductor fins 102, 104 have unequal concentrations of first and second semiconductor materials therein relative to each other. The concentrations of the first and second semiconductor materials in the first and second semiconductor fins 102, 104 are predetermined according to required threshold voltages of fin transistors including the first and second semiconductor fins 102, 104. $C_1$ and $C_2$ denote concentrations of the second semiconductor material in the first and second semiconductor fins 102, 104 respectively thus $C_1$ and $C_2$ have different values.

In some embodiments, the first semiconductor fins 102 are formed by patterning the substrate 100. For example, the first semiconductor fins 102 are Si fins formed by patterning a silicon bulk substrate, thus the first semiconductor fins 102 are at least substantially free of the second semiconductor material. In some embodiments, the first semiconductor fins 102 are formed by depositing or epitaxially growing a semiconductor layer including the first and second semiconductor materials. For example, the first semiconductor fins 102 are SiGe fins, which are formed by epitaxial growth from the substrate 100, and have unequal concentrations of Si and Ge relative to the second semiconductor fins 104.

In some embodiments, the upper portions of the second semiconductor fins 104a are SiGe fins formed by depositing a SiGe layer on the substrate 100 or by epitaxially growing from the seed regions 104b in the substrate 100. The seed regions 104b may be formed by patterning the substrate 100. The SiGe fins have the general chemical formula $Si_{1-x}Ge_x$, where x is from about 0.1 to about 0.3.

The epitaxially grown SiGe fins can be formed by supplying a silicon-containing gas such as, for example, silane, and a germanium-containing gas such as, for example, germane. The components of the gas can be energized to form the SiGe fins by providing sufficient thermal energy for the reaction to occur, for example, by heating the substrate 100 to a sufficiently high temperature.

Figure 2:
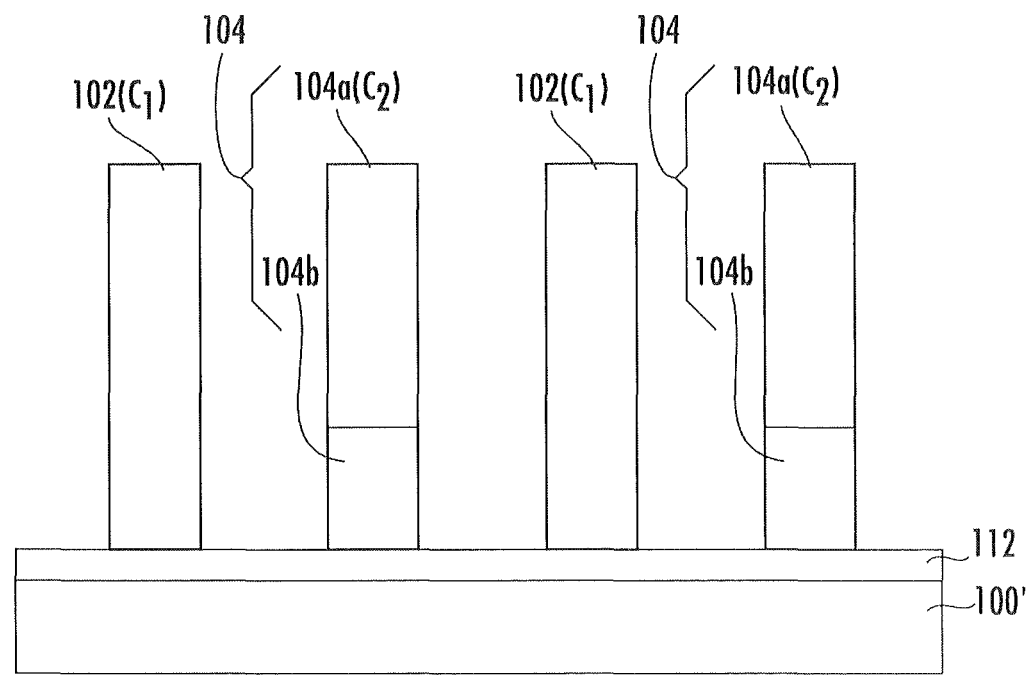

Referring to FIG. 2, the first and second semiconductor fins 102, 104 are provided on a Silicon On Insulator (SOI) substrate, which includes a buried insulator 112 and a semiconductor substrate 100'. The first and second semiconductor fins 102, 104 may contact an upper surface of the buried insulator 112.

Figure 3:
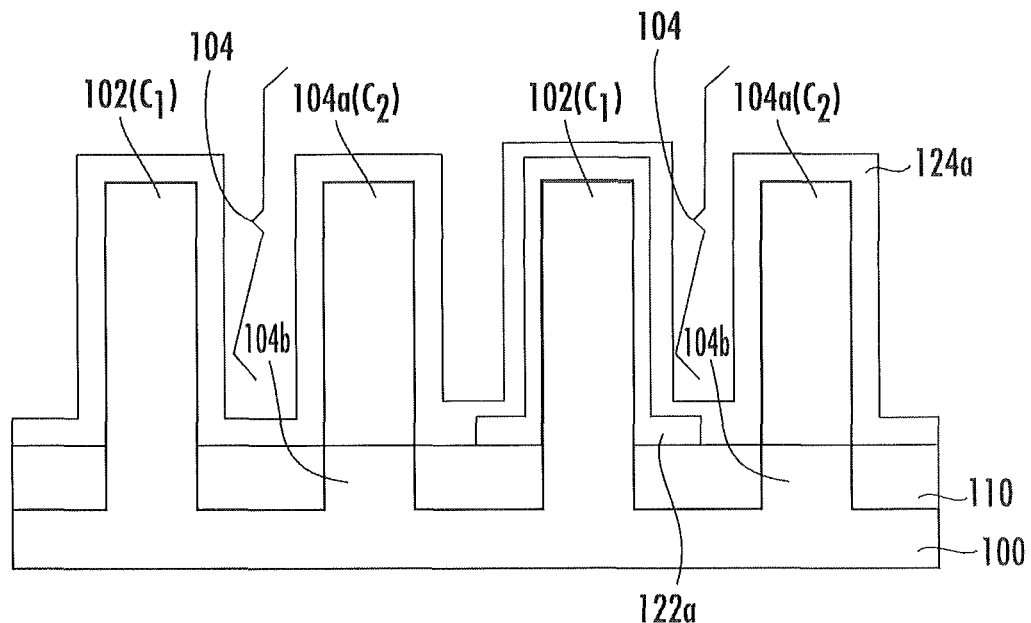
Figure 4:
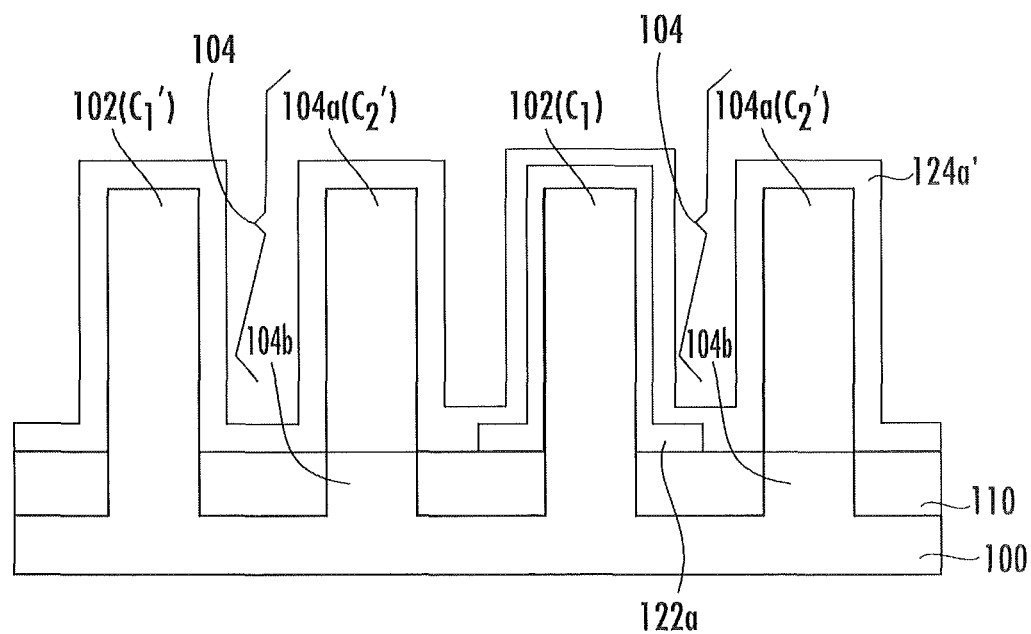
Figure 5:
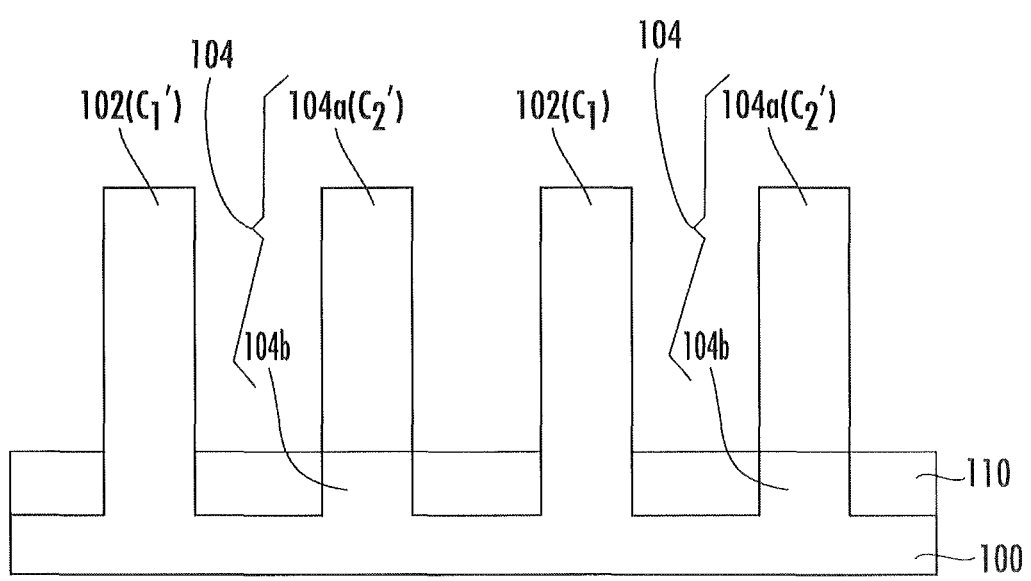

FIGS. 3 to 5 illustrate a method of fabricating semiconductor fins having at least three different concentrations of the second semiconductor material therein according to some embodiments of the present inventive concept.

Referring to FIG. 3, a mask layer 122a covering at least one among the first semiconductor fins 102 is formed on the structure illustrated in FIG. 1 and then a compound semiconductor layer 124a including the first and second semiconductor materials is formed directly onto sidewalls of the first and second semiconductor fins 102, 104 not covered by the mask layer 122a. According to some embodiments, the mask layer 122a and the compound semiconductor layer 124a are formed on the structure illustrated in FIG. 2.

The mask layer 122a may include any appropriate materials and, while illustrated as a single layer, the mask layer 122a may include multiple layers. A thickness of the mask layer 122a may be in a range from about 5 to about 20 nm and it can be varied depending on fin pitch. The thickness of the mask layer 122a may be determined in proportion to fin pitches. In some embodiments, the mask layer 122a includes $Si_3N_4$.

According to some embodiments, the compound semiconductor layer 124a is formed by a non-selective deposition process thus the compound semiconductor layer 124a may be formed on the entire underlying structure including on the isolation layer 110 and the mask layer 122a. The non-selective deposition process enables an oxidized compound semiconductor layer subsequently formed to have a uniform thickness. As appreciated by the present inventors, if the compound semiconductor layer 124a is selectively formed on the first and second semiconductor fins 102, 104 not covered by the mask layer 122a, the oxidized compound semiconductor layer is also selectively formed on the first and second semiconductor fins 102, 104 not covered by the mask layer 122a. Accordingly, removing of the oxidized compound semiconductor layer may cause a recess of the isolation layer 110 adjacent to the first and second semiconductor fins 102, 104 not covered by the mask layer 122a. That is, removing of the oxidized compound semiconductor layer may cause a divot in the isolation layer 110.

A thickness of the compound semiconductor layer 124a may be in a range from about 5 to about 20 nm and can be varied depending on fin pitch. The thickness of the compound semiconductor layer 124a may be determined in proportion to fin pitch. The compound semiconductor layer 124a may be single crystal as deposited or may be converted into single crystal layer through a re-growth process at a low temperature after depositing the compound semiconductor layer 124a. The re-growth process may convert at least a portion of the compound semiconductor layer 124a into single crystal. In some embodiments, the compound semiconductor layer 124a includes silicon (Si) as the first semiconductor material and germanium (Ge) as the second semiconductor material. The concentration of Ge in the compound semiconductor layer 124a may be in a range from about 10% to about 40%, however, other concentrations are possible.

Referring to FIG. 4, an oxidation process is performed to oxidize the compound semiconductor layer 124a. The oxidization process increases the concentrations of the second semiconductor material within the first and second semiconductor fins 102, 104 not covered by the mask layer 122a. Specifically, the oxidation process oxidizes the first semiconductor material (e.g., Si) within the compound semiconductor layer 124a and drives the second semiconductor material (e.g., Ge) within the compound semiconductor layer 124a into the sidewalls of the first and second semiconductor fins 102, 104 not covered by the mask layer 122a. Accordingly, after the oxidation process, the concentrations of the second semiconductor material $C_1'$ and $C_2'$ within the first and second semiconductor fins 102, 104 not covered by the mask layer 122a become greater than the concentrations of the second semiconductor material $C_1$ and $C_2$ within the first and second semiconductor fins 102, 104 before the oxidation process respectively. However, the concentration of the second semiconductor material $C_1$ within the first semiconductor fin 102 covered by the mask layer 122a is not increased because the mask layer 122a is between the compound semiconductor layer 124a and the underlying first semiconductor fin 102 during the oxidation process.

According to some embodiments, the oxidation process oxidizes the entire compound semiconductor layer 124 and forms an oxidized compound semiconductor layer 124a'.

The temperature of the oxidation process may be in a range from about 900° C. to about 1100° C. In some embodiments, the oxidation process continues until at least a majority of the second semiconductor material within the compound semiconductor layer 124a is driven into the sidewalls of the first and second semiconductor fins 102, 104.

Referring to FIG. 5, the mask layer 122 and the oxidized compound semiconductor layer 124a' are removed to expose the sidewalls of the first and second semiconductor fins 102, 104, which have three unequal concentrations, $C_1$, $C_1'$ and $C_2'$, of the second semiconductor material therein. The mask layer 122 and the oxidized compound semiconductor layer 124a' may be removed by any appropriate etch process, wet or dry, which selectively etches those layers but not the first and second semiconductor fins 102, 104. In some embodiments, a wet etch process with hydrofluoric acid is used to remove the oxidized compound semiconductor layer 124a'.

As illustrated above, according to some embodiments, the first and second semiconductor fins 102, 104, having three unequal concentrations of the second semiconductor material therein, $C_1$, $C_1'$ and $C_2'$, can be formed with one compound semiconductor layer 124a since the mask layer 122a covering one among the first semiconductor fins 102 but exposing remaining ones of the first and second semiconductor fins 102, 104 is formed.

Figure 6:
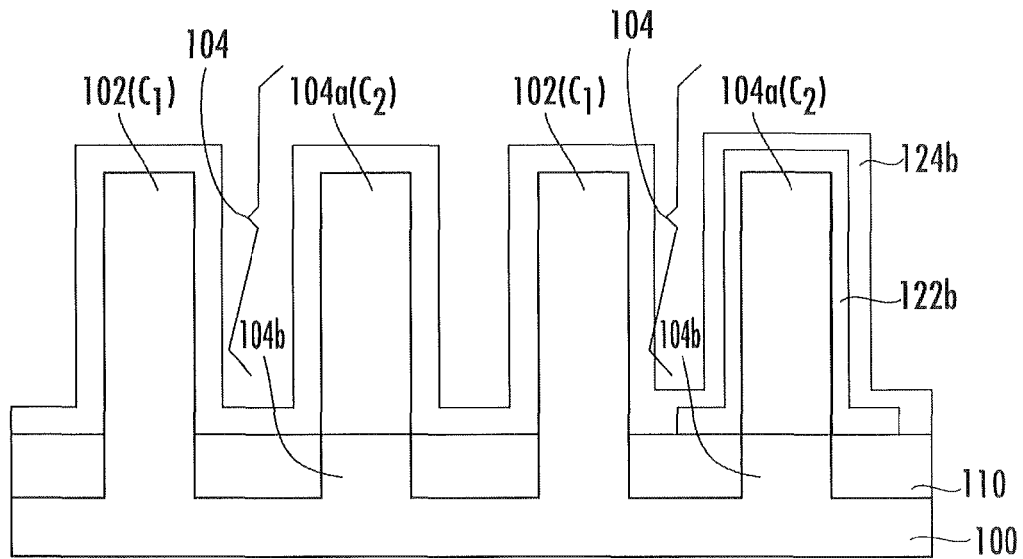
FIGS. 6 to 8 are cross-sectional views illustrating intermediate structures provided as portions of a method of fabricating semiconductor fins according to some embodiments of the present inventive concept.
Figure 7:
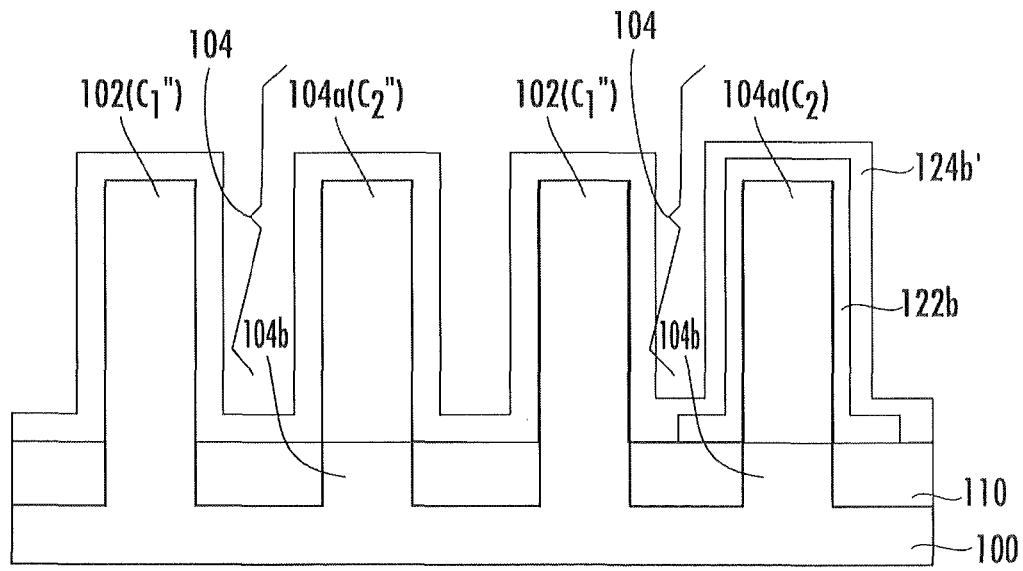
Figure 8:
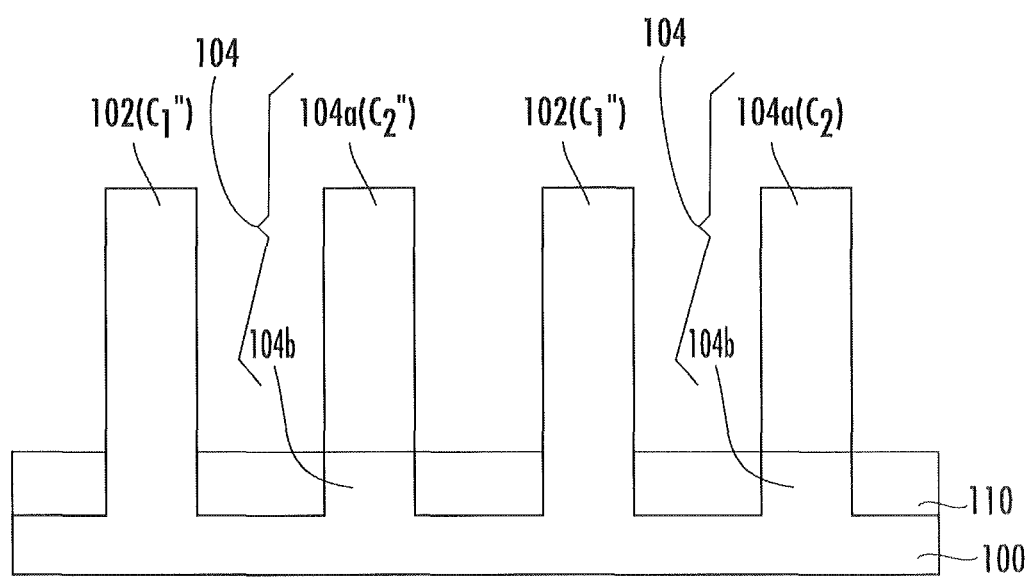

FIGS. 6 to 8 are cross-sectional views illustrating intermediate structures provided as portions of a method of fabricating semiconductor fins according to some embodiments of the present inventive concept.

Referring to FIGS. 6 and 7, a mask layer 122b covering one among the second semiconductor fins 104 is formed on the structure illustrated in FIG. 1 and then a compound semiconductor layer 124b including the first and second semiconductor materials are formed directly onto sidewalls of the first and second semiconductor fins 102, 104 not covered by the mask layer 122b. According to some embodiments, the compound semiconductor layer 124b is formed by a non-selective deposition process thus the compound semiconductor layer 124b may be formed on the entire underlying structure including on the isolation layer 110.

Then an oxidation process is performed to increase concentrations of the second semiconductor material within the first and second semiconductor fins 102, 104 not covered by the mask layer 122b. Specifically, the oxidation process oxidizes the first semiconductor material (e.g., Si) within the compound semiconductor layer 124b and drives the second semiconductor material (e.g., Ge) within the compound semiconductor layer 124b into the sidewalls of the first and second semiconductor fins 102, 104 not covered by the mask layer 122b. After the oxidation process, the concentrations of the second semiconductor material, $C_1''$ and $C_2''$, within the first and second semiconductor fins 102, 104 not covered by the mask layer 122b become greater than the concentrations of the second semiconductor material, $C_1$ and $C_2$, within the first and second semiconductor fins 102, 104 before the oxidation process and an oxidized compound semiconductor layer 124b' is formed. However, the concentration of the second semiconductor material $C_2$ within the one among the second semiconductor fins 104 covered by the mask layer 122b is not increased.

Referring to FIG. 8, the sidewalls of the first and second semiconductor fins 102, 104 having three unequal concentrations of the second semiconductor material therein, $C_1''$, $C_2''$ and $C_2$, are exposed by removing the mask layer 122b and the oxidized compound semiconductor layer 124b'.

Figure 9:
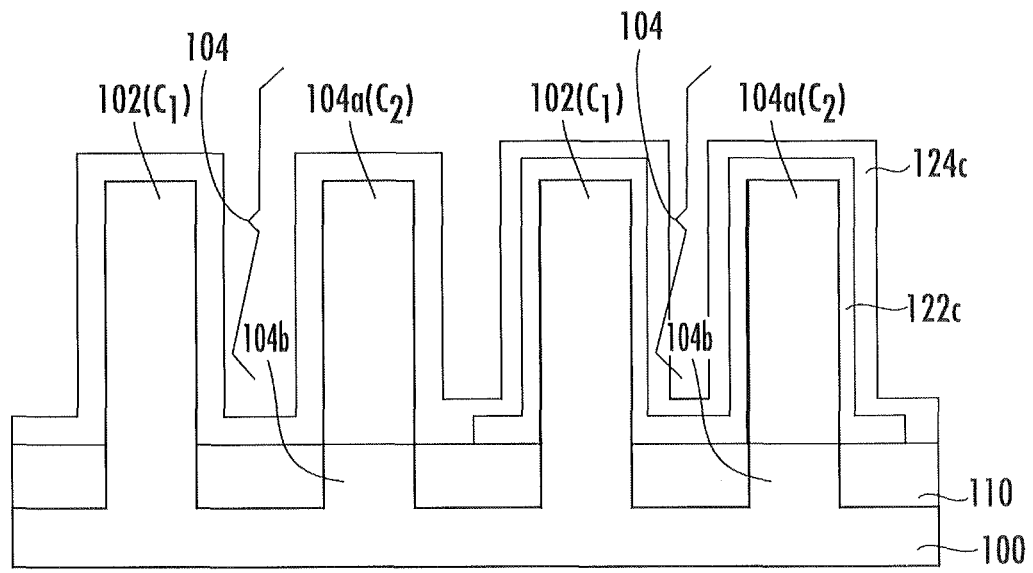
FIGS. 9 to 11 are cross-sectional views illustrating intermediate structures provided as portions of a method of fabricating semiconductor fins according to some embodiments of the present inventive concept.
Figure 10:
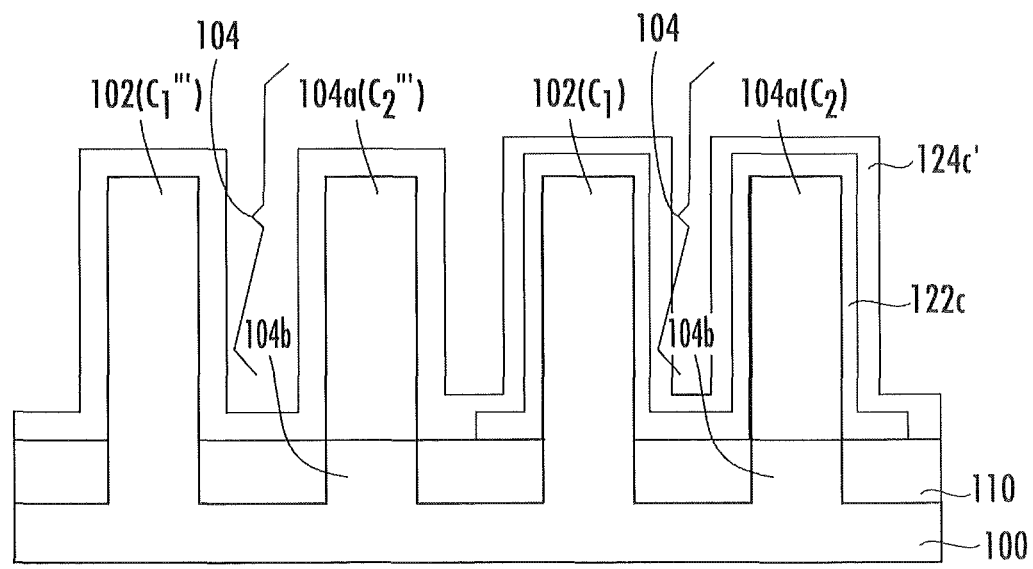
Figure 11:
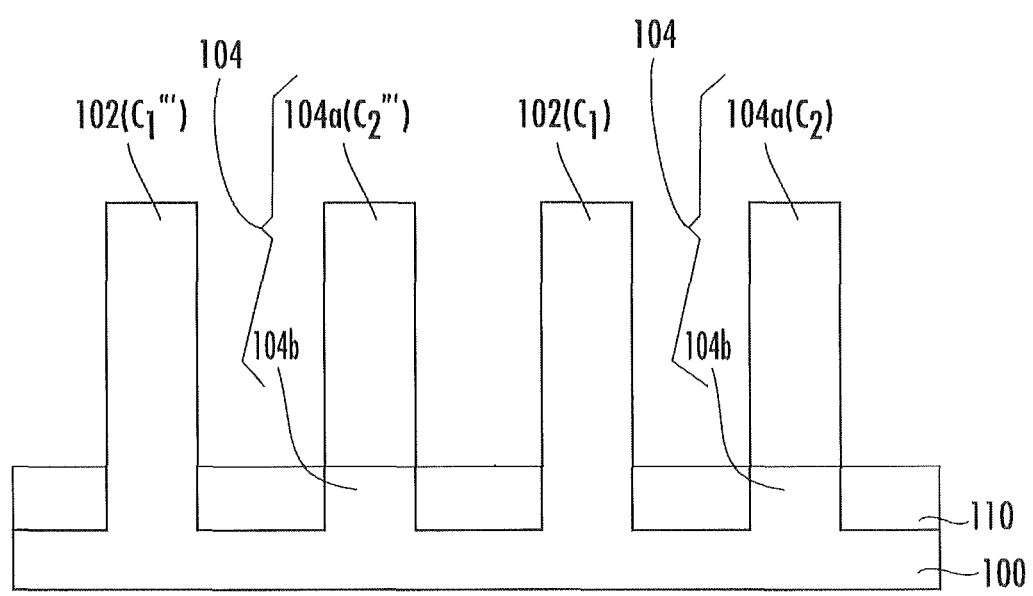

FIGS. 9 to 11 are cross-sectional views illustrating intermediate structures provided as portions of a method of fabricating semiconductor fins according to some embodiments of the present inventive concept.

Referring to FIGS. 9 and 10, a mask layer 122c covering at least one among the first semiconductor fins 102 and at least one among the second semiconductor fins 104 is formed on the structure illustrated in FIG. 1. Then a compound semiconductor layer 124c including the first and second semiconductor materials are formed directly onto sidewalls of the first and second semiconductor fins 102, 104 not covered by the mask layer 122c. As illustrated in FIG. 9, in some embodiments, the compound semiconductor layer 124c is formed by a non-selective deposition process thus the compound semiconductor layer 124c may be formed on the entire underlying structure including on the isolation layer 110 and the mask layer 122c.

Then an oxidation process is performed to increase concentrations of the second semiconductor material within the first and second semiconductor fins 102, 104 not covered by the mask layer 122c. After the oxidation process, the concentrations of the second semiconductor material, $C_1'''$ and $C_2'''$, within the first and second semiconductor fins 102, 104 become greater than the concentrations of the second semiconductor material, $C_1$ and $C_2$, within the first and second semiconductor fins 102, 104 before the oxidation process and an oxidized compound semiconductor layer 124c' is formed. However, the concentrations of the second semiconductor material $C_1$ and $C_2$ within the first and second semiconductor fins 102, 104 covered by the mask layer 122c are not increased.

Referring to FIG. 11, the sidewalls of the first and second semiconductor fins 102, 104 having four unequal concentrations of the semiconductor material therein, $C_1$, $C_1'''$, $C_2$ and $C_2'''$, are exposed by removing the mask layer 122c and the oxide layer 124c'.

Figure 12:
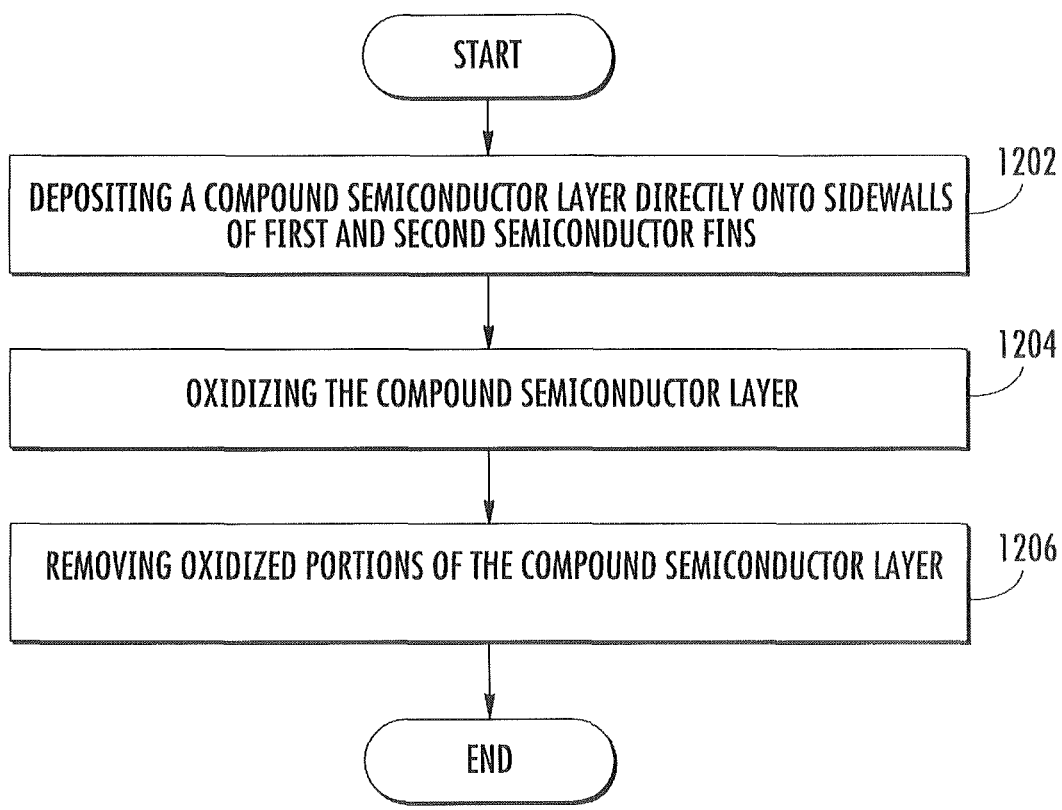
FIGS. 12 and 13 are flow diagrams illustrating methods of fabricating semiconductor fins according to some embodiments of the present inventive concept.

FIG. 12 is a flow diagram illustrating a method of fabricating semiconductor fins according to some embodiments of the present inventive concept. Specifically, the flow diagram illustrates a method of fabricating semiconductor fins having unequal concentrations of first and second semiconductor materials therein.

The method includes depositing 1202 a compound semiconductor layer including the first and second semiconductor materials directly onto sidewalls of first and second semiconductor fins provided on a substrate. The first and second semiconductor fins have unequal concentrations of the first and second semiconductor materials therein relative to each other. The concentrations of the first and second semiconductor materials in the first and second semiconductor fins are predetermined according to required threshold voltages of fin transistors including the first and second semiconductor fins.

In some embodiments, the compound semiconductor layer may be formed by a non-selective deposition process thus the compound semiconductor layer may be formed on the entire underlying structure. A thickness of the compound semiconductor layer may be in a range from about 5 to about 20 nm and it can be varied depending on fin pitch. In some embodiments, the compound semiconductor layer includes silicon (Si) as the first semiconductor material and germanium (Ge) as the second semiconductor material. The concentration of Ge in the compound semiconductor layer may be in a range from about 10% to about 40%.

The compound semiconductor layer may be single crystal as deposited or may be converted into single crystal layer through a re-growth process at a low temperature after depositing the compound semiconductor layer. The re-growth process may convert at least a portion of the compound semiconductor layer into single crystal.

Heights of the first and second semiconductor fins may be in a range from about 20 nm to about 50 nm and widths of those may be in a range from about 5 nm to 20 nm. The first semiconductor fins may be formed by patterning the substrate and the second semiconductor fins may be formed by epitaxial growth from seed regions in the substrate. For example, according to some embodiments, the first semiconductor fins are Si fins formed by patterning a silicon bulk substrate and the second semiconductor fins are SiGe fins formed by epitaxially growing from seed regions in the substrate. The SiGe fins may have the general chemical formula $Si_{1-x}Ge_x$, where x is from about 0.1 to about 0.3.

The method continues with oxidizing 1204 the compound semiconductor layer. This oxidation process oxidizes the first semiconductor material within the compound semiconductor layer while driving the second semiconductor material into the sidewalls of the first and second semiconductor fins. Accordingly, the concentrations of the second semiconductor material within the first and second semiconductor fins after the oxidation, process are greater than the concentrations of the second semiconductor material within the first and second semiconductor fins before the oxidation process.

In some embodiments, the oxidation process may continue until driving at least a majority of the second semiconductor material within the compound semiconductor layer into the first and second semiconductor fins. The oxidation process may oxidize the entire compound semiconductor layer and may form an oxidized compound semiconductor layer. According to some embodiments, temperature of the oxidation process may be in a range from about 900° C. to about 1100° C.

The method continues with removing 1206 the oxidized portions of the compound semiconductor layer. Removing the oxidized portions of the compound semiconductor layer exposes the sidewalls of the first and second semiconductor fins having unequal concentrations of the second semiconductor material therein.

Figure 13:
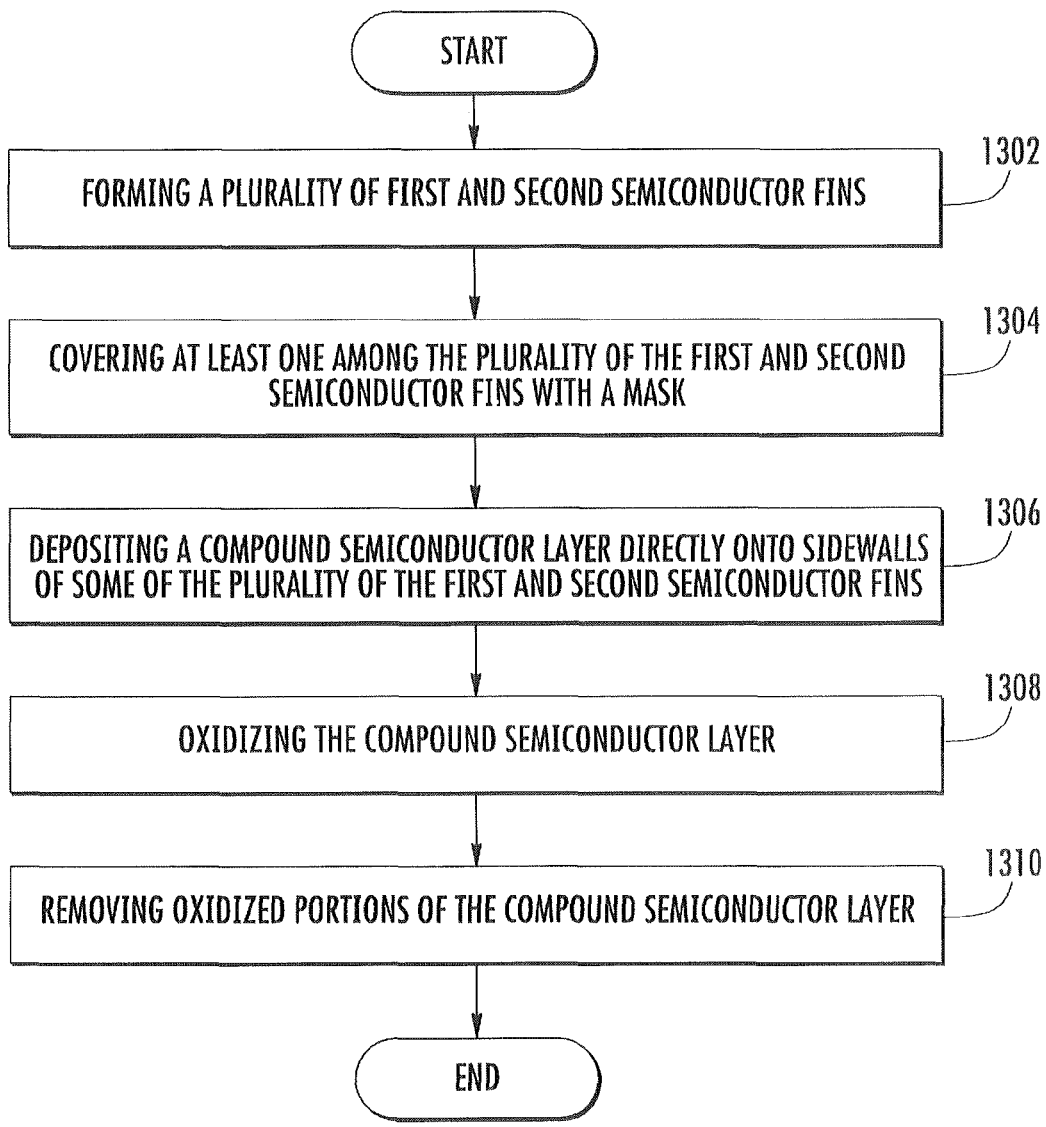

FIG. 13 is a flow diagram illustrating a method of fabricating semiconductor fins according to some embodiments of the present inventive concept. Specifically, the flow diagram illustrates a method of fabricating semiconductor fins having unequal concentrations of first and second semiconductor materials therein by using one mask and one compound semiconductor layer.

The method includes forming 1302 a plurality of first and second semiconductor fins including first and second semiconductor materials respectively on a substrate. In some embodiments, the first and second semiconductor fins have unequal concentrations of the first and second semiconductor materials therein relative to each other. In some embodiments, the first semiconductor fins are Si fins, which are at least substantially free of the second semiconductor material. The concentrations of the first and second semiconductor materials in the first and second semiconductor fins are predetermined according to required threshold voltages of fin transistors including the first and second semiconductor fins.

The method continues with covering 1304 at least one among the plurality of first and second semiconductor fins with a mask. A thickness of the mask may be in a range from about 5 to about 20 nm and it can be varied depending on fin pitch. The mask may include any appropriate materials and may include multiple layers. In some embodiments, the mask includes $Si_3N_4$.

The method continues with depositing 1306 a compound semiconductor layer comprising the first and second semiconductor materials directly onto sidewalls of some of the plurality of first and second semiconductor fins not covered by the mask. A thickness of the compound semiconductor layer may be in a range from about 5 to about 20 nm and it can be varied depending on fin pitches. In some embodiments, the compound semiconductor layer includes silicon (Si) as the first semiconductor material and germanium (Ge) as the second semiconductor material. The concentration of Ge in the compound semiconductor layer may be in a range from about 10% to about 40%.

The method continues with oxidizing 1308 the compound semiconductor layer. The oxidization process increases concentrations of the second semiconductor material within the first and second semiconductor fins not covered by the mask. Specifically, the oxidation process oxidizes the first semiconductor material within the compound semiconductor layer and drives the second semiconductor material within the compound semiconductor layer into the sidewalls of the first and second semiconductor fins not covered by the mask. Accordingly, after the oxidation process the concentrations of the second semiconductor material within the first and second semiconductor fins not covered by the mask become greater than the concentrations of the second semiconductor material within the first and second semiconductor fins before the oxidation process. However, the concentration of the second semiconductor material within the one among the plurality of first and second semiconductor fins covered by the mask is not increased because the mask is between the compound semiconductor layer and the one among the plurality of the first and second semiconductor fins during the oxidation process.

According to some embodiments, the oxidation process oxidizes the entire compound semiconductor layer and forms an oxidized compound semiconductor layer. A temperature of the oxidation process may be in a range from about 900° C. to about 1100° C. The oxidation process may continue until at least a majority of the second semiconductor material within the compound semiconductor layer is driven into the sidewalls of the plurality of the first and second semiconductor fins.

The method continues with removing 1310 oxidized portions of the compound semiconductor layer. Any appropriate etch process, wet or dry, which selectively etches the oxidized portions of the compound semiconductor layer but not etch the first and second semiconductor fins can be used. In some embodiments, a wet etch process with hydrofluoric acid is used to remove the oxidized compound semiconductor layer. Then the mask may be removed.

Fin transistors according to some embodiments of the present inventive concept are applicable to any integrated circuit devices including a Static Random Access Memory (SRAM).

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, comprising:
    depositing a compound semiconductor layer comprising first and second semiconductor materials directly onto sidewalls of first and second semiconductor fins having unequal concentrations of the first and second semiconductor materials therein relative to each other, said depositing further comprising depositing the compound semiconductor layer directly onto an isolation layer extending adjacent the first and second semiconductor fins and onto a mask layer covering a third semiconductor fin;
    oxidizing the first semiconductor material within the compound semiconductor layer for a sufficient duration to drive at least a portion of the second semiconductor material within the compound semiconductor layer into the first and second semiconductor fins, using the mask layer to block transfer of the second semiconductor material from the compound semiconductor layer into the third semiconductor fin; and
    removing oxidized portions of the compound semiconductor layer to thereby expose the sidewalls of the first and second semiconductor fins having unequal concentrations of the second semiconductor material therein and expose the isolation layer extending adjacent the first and second semiconductor fins.

2. The method of claim 1, wherein the compound semiconductor layer comprises $Si_{1-x}Ge_x$, where x is in a range from about 0.1 to about 0.4.

3. The method of claim 1, wherein the second semiconductor fin is at least substantially free of the second semiconductor material.

4. The method of claim 1, wherein said oxidizing is preceded by converting at least a portion of the deposited compound semiconductor layer into single crystal.

5. The method of claim 1, wherein said oxidizing comprises oxidizing the entire compound semiconductor layer.

6. The method of claim 1, wherein the isolation layer is an oxide-based isolation layer.

7. The method of claim 1, wherein a sequence of said depositing, oxidizing and removing is repeated at least once to thereby define at least four semiconductor fins having unequal concentration of the second semiconductor material therein relative to each other.

8. The method of claim 7, wherein one of the at least four semiconductor fins is devoid of the second semiconductor material.

9. A method of forming an integrated circuit device, comprising:
   forming a plurality of Si and SiGe fins on a substrate including an isolation layer thereon;
   forming a mask layer covering at least one among the plurality of Si and SiGe fins and covering at least a portion of the isolation layer;
   forming a compound semiconductor layer comprising Si and Ge directly on sidewalls of some of the plurality of Si and SiGe fins not covered by the mask layer and directly on the isolation layer and the mask layer;
   oxidizing the entire compound semiconductor layer to oxidize Si therein for a sufficient duration to drive at least a portion of Ge within the compound semiconductor layer into the sidewalls of the some of the plurality of Si and SiGe fins not covered by the mask; and
   removing oxidized portions of the compound semiconductor layer to thereby expose the mask, the isolation layer covered by the compound semiconductor layer and the sidewalls of the some of the plurality of Si and SiGe fins not covered by the mask.

10. The method of claim 9, wherein said forming comprises forming the plurality of SiGe fins by epitaxially growing from a plurality of seed regions in the substrate.

11. A method of forming an integrated circuit device, comprising:
   epitaxially growing a plurality of semiconductor fins from a corresponding plurality of semiconductor seed regions within an oxide-based isolation layer;
   covering at least some of the semiconductor fins with a mask layer;
   depositing a compound SiGe layer on the mask layer, an upper surface of the oxide-based isolation layer and directly onto sidewalls of the semiconductor fins not covered by the mask layer;
   oxidizing the compound SiGe layer for a sufficient duration to drive at least some of the Ge within the compound SiGe layer into the semiconductor fins not covered by the mask layer, using the mask layer to block transfer of Ge from the compound SiGe layer into semiconductor fins covered by the mask layer; and
   etching oxidized portions of the compound SiGe layer to thereby expose the sidewalls of the semiconductor fins not covered by the mask layer and expose the upper surface of the oxide-based isolation layer.

* * * * *